(12) United States Patent  (10) Patent No.: US 7,420,438 B2
Nakai et al.  (45) Date of Patent: Sep. 2, 2008

(54) FRONT END MODULE

(75) Inventors: Shinya Nakai, Tokyo (JP); Hideaki Fujioka, Tokyo (JP)

(73) Assignee: TDK Corporation, Tokyo (JP)

( * ) Notice: Subject to any disclaimer, the term of this patent is extended or adjusted under 35 U.S.C. 154(b) by 377 days.

(21) Appl. No.: 10/545,270

(22) PCT Filed: Feb. 9, 2004

(86) PCT No.: PCT/JP2004/001329

§ 371 (c)(1),
(2), (4) Date: Aug. 11, 2005

(87) PCT Pub. No.: WO2004/073191

PCT Pub. Date: Aug. 26, 2004

(65) Prior Publication Data

US 2006/0192632 A1 Aug. 31, 2006

(30) Foreign Application Priority Data

Feb. 14, 2003 (JP) ............................. 2003-037472

(51) Int. Cl.
H03H 9/70 (2006.01)
H04B 1/46 (2006.01)
H04Q 7/20 (2006.01)
H04M 1/00 (2006.01)

(52) U.S. Cl. ...................... 333/133; 456/78; 456/82; 456/456.1; 456/552.1

(58) Field of Classification Search ................. 333/133; 455/78, 82–83, 456.1, 552.1, 553.1
See application file for complete search history.

(56) References Cited

U.S. PATENT DOCUMENTS

| 5,386,203 | A | * | 1/1995 | Ishihara ...................... 333/129 |
| 5,864,260 | A | | 1/1999 | Lee |
| 6,025,761 | A | | 2/2000 | Watanabe et al. |
| 6,326,864 | B1 | | 12/2001 | Takamine et al. |
| 6,662,021 | B2 | * | 12/2003 | Kang et al. ............... 455/553.1 |
| 6,667,723 | B2 | * | 12/2003 | Forrester .................... 343/858 |
| 6,750,737 | B2 | * | 6/2004 | Uriu et al. ................... 333/133 |
| 6,980,067 | B2 | * | 12/2005 | Forrester et al. ............ 333/133 |
| 2002/0032038 | A1 | | 3/2002 | Furutani et al. |
| 2002/0183016 | A1 | | 12/2002 | Kemmochi et al. |
| 2002/0186097 | A1 | | 12/2002 | Sakuragawa et al. |
| 2003/0022638 | A1 | | 1/2003 | Imai et al. |

FOREIGN PATENT DOCUMENTS

| EP | 0 959 567 A1 | 11/1999 |
| EP | 1 223 634 A2 | 7/2002 |
| EP | 1 261 143 A1 | 11/2002 |

(Continued)

Primary Examiner—Barbara Summons
(74) Attorney, Agent, or Firm—Oliff & Berridge, PLC

(57) ABSTRACT

A front end module (2) comprises: a triplexer (11) for separating the AMPS band, the PCS band and the GPS band from one another; a duplexer (12) for separating transmission signals and reception signals in the AMPS band from each other; and a duplexer (13) for separating transmission signals and reception signals in the PCS band from each other. The duplexers (12, 13) each include an acoustic wave element that functions as a filter. A single multilayer substrate is used to integrate the triplexer (11) and the duplexers (12, 13). The triplexer (11) is made up of conductor layers located inside or on the surface of the multilayer substrate.

6 Claims, 15 Drawing Sheets

FOREIGN PATENT DOCUMENTS

| | | |
|---|---|---|
| JP | A-08-191230 | 7/1996 |
| JP | A-09-307399 | 11/1997 |
| JP | A-11-127052 | 5/1999 |
| JP | A-2000-261288 | 9/2000 |
| JP | A-2002-043977 | 2/2002 |
| JP | A-2002-101005 | 4/2002 |
| JP | A-2002-111317 | 4/2002 |
| JP | A-2002-141764 | 5/2002 |
| JP | A-2002-208873 | 7/2002 |
| JP | A-2002-223102 | 8/2002 |
| JP | A-2003-008385 | 1/2003 |
| JP | A-2003-032140 | 1/2003 |
| WO | WO 01/48935 A1 | 7/2001 |

* cited by examiner

FRONT END MODULE

TECHNICAL FIELD

The present invention relates to a front end module for processing transmission signals and reception signals in a communications device such as a cellular phone.

BACKGROUND ART

Third-generation cellular phones have been introduced and it is getting required that such phones have not only a speech function but also a high-speed data communications function that enables transmission of electronic mails and image data. It is further required that such phones have a position detecting function.

For example, the law requiring that cellular phones have a position detecting function has been enacted in the United States. In the States, for example, this requirement is accomplished in such a manner that cellular phones for the code division multiple access (that may he hereinafter referred to as CDMA) system are equipped with the receiving function of the global positioning system (GPS) using a frequency band around 1500 MHz as the position detecting function, wherein the phones for the CDMA system are operable in two frequency bands (dual bands) including a frequency band approximately from 800 to 900 MHz that is used in the advanced mobile phone system (AMPS) and a frequency band approximately from 1800 to 2000 MHz that is used in the personal communications service (PCS). It is required that this type of cellular phones deal with these three frequency bands.

If a new function is added to cellular phones as described above, the circuit is made more complicated and the number of components is increased. Therefore, higher-density mounting techniques are required for the cellular phones. Under such a circumstance, it is necessary to achieve a reduction in size and weight of the components and to achieve combination and integration of the components for the high frequency circuits inside the cellular phones to reduce the mounting space.

The Published Unexamined Japanese Patent Application 2003-8385 discloses a composite LC filter circuit for separating the frequency bands of AMPS, PCS and GPS from one another.

The Published Unexamined Japanese Patent Application 2002-101005 discloses a front end module for processing transmission signals and reception signals of each of three communications systems using three frequency bands. This front end module separates a low frequency band from a high frequency band through the use of a diplexer. The low frequency band includes the frequency band of the first communications system. The high frequency band includes the two frequency bands of the second and third communications systems. An antenna switch separates the transmission signals and the reception signals of the first communications system from each other. Another antenna switch separates the reception signals of the second and third communications systems from the transmission signals of the second and third communications systems. Two surface acoustic wave (SAW) filters separate the reception signals of the second communications system from the reception signals of the third communications system. The Published Unexamined Japanese Patent Application 2002-101005 discloses that the components of the front end module are integrated on a multilayer ceramic substrate.

The Published Unexamined Japanese Patent Application 2002-43977 discloses a high frequency module for processing transmission signals and reception signals of each of three communications systems using three frequency bands. This high frequency module separates a low frequency band from a high frequency band through the use of a diplexer. The high frequency band includes the two frequency bands of the first and second communications systems. The low frequency band includes the frequency band of the third communications system. A first high frequency switch separates the reception signals of the first and second communications systems from the transmission signals of the first and second communications systems. A second high frequency switch separates the transmission signals and the reception signals of the third communications system from each other. Two SAW filters separate the reception signals of the first communications system from the reception signals of the second communications system. In addition, the Published Unexamined Japanese Patent Application 2002-43977 discloses that the components of the high frequency module are combined through the use of a layered structure made up of a plurality of stacked sheet layers.

To achieve the above-mentioned cellular phones having the speech function, the high-speed data communications function and the position detecting function, it is desirable to implement front end modules capable of processing transmission signals and reception signals in each of the first and second frequency bands and reception signals for the position detecting function in the third frequency band.

The composite LC filter circuit disclosed in the Published Unexamined Japanese Patent Application 2003-8385 has the function of separating the three frequency bands from one another but does not have any function of separating transmission signals and reception signals from each other in each of the frequency bands. Therefore, when the composite LC filter circuit is used in a communications device such as a cellular phone, it is required to provide a circuit for separating the transmission signals and the reception signals from each other in each of the frequency bands, in addition to the composite LC filter circuit. No consideration is given in the Published Unexamined Japanese Patent Application 2003-8385 to a reduction in size and weight and combination and integration of components in such a case.

The front end module disclosed in the Published Unexamined Japanese Patent Application 2002-101005 separates transmission signals from reception signals through the use of the antenna switches. In the CDMA system, it is required that each of the transmission function and the reception function operates all the time. Consequently, this front end module has a problem that it is not operable in the CDMA system.

The high frequency module disclosed in the Published Unexamined Japanese Patent Application 2002-43977 separates transmission signals from reception signals through the use of the high frequency switch. Therefore, like the front end module of the Published Unexamined Japanese Patent Application 2002-101005, this high frequency module has a problem that it is not operable in the CDMA system.

In the Published Unexamined Japanese Patent Application 2002-101005 and the Published Unexamined Japanese Patent Application 2002-43977, the duplexers including two SAW filters for separating the reception signals of two communications systems from each other are called SAW duplexers. However, duplexers generally mean those for separating transmission signals and reception signals from each other. In the embodiment of the present invention, too, those for separating transmission signals and reception signals from each other are called duplexers. Therefore, the SAW duplexers disclosed in the Published Unexamined Japanese Patent Application 2002-101005 and the Published Unexamined Japanese Patent Application 2002-43977 are different from the duplexers of the embodiment of the present invention, in terms of function.

DISCLOSURE OF THE INVENTION

It is an object of the invention to provide a front end module that is capable of processing transmission signals and reception signals in each of first and second frequency bands and reception signals in a third frequency band and operable in the code division multiple access system, and that easily achieves a reduction in size and weight, and combination and integration of components.

A front end module of the invention is a module for processing transmission signals and reception signals in each of a first frequency band and a second frequency band and for processing reception signals in a third frequency band. The front end module comprises: a first separating means connected to an antenna and separating the first to third frequency bands from one another; a second separating means connected to the first separating means, including two acoustic wave elements each of which functions as a filter, and separating the transmission signals and the reception signals in the first frequency band from each other; a third separating means connected to the first separating means, including two acoustic wave elements each of which functions as a filter, and separating the transmission signals and the reception signals in the second frequency band from each other; and a single multilayer substrate for integrating the first to third separating means. The first separating means is made up of conductor layers located inside or on a surface of the multilayer substrate.

According to the front end module of the invention, the first separating means separates the first to third frequency bands from one another. The second separating means including the two acoustic wave elements separates the transmission signals and the reception signals in the first frequency band from each other. The third separating means including the two acoustic wave elements separates the transmission signals and the reception signals in the second frequency band from each other. The single multilayer substrate is used to integrate the first to third separating means. In addition, the first separating means is made up of the conductor layers located inside or on the surface of the multilayer substrate. The acoustic wave elements are those utilizing acoustic waves, and may be surface acoustic wave elements utilizing surface acoustic waves or bulk acoustic wave elements utilizing bulk acoustic waves.

In the front end module of the invention, the two acoustic wave elements that the second separating means includes and the two acoustic wave elements that the third separating means includes may be mounted on the multilayer substrate. In addition, at least part of circuit portions of the second and third separating means except the acoustic wave elements may be made up of the conductor layers located inside or on the surface of the multilayer substrate.

In the front end module of the invention, the first separating means may incorporate: a filter allowing signals of frequencies in the first frequency band to pass and intercepting signals of frequencies in the second and third frequency bands; a filter allowing signals of frequencies in the second frequency band to pass and intercepting signals of frequencies in the first and third frequency bands; and a filter allowing signals of frequencies in the third frequency band to pass and intercepting signals of frequencies in the first and second frequency bands.

In the front end module of the invention, the first separating means may incorporate: a first filter connected to the antenna and allowing signals of frequencies in one of the first to third frequency bands to pass and intercepting signals of frequencies in the other two of the frequency bands; a second filter connected to the antenna, intercepting signals of frequencies in the one of the frequency bands that the first filter allows to pass, and allowing signals of frequencies in the two of the frequency bands that the first filter intercepts to pass; a third filter connected to the second filter, allowing signals of frequencies in one of the two of the frequency bands to pass, and intercepting signals of frequencies in the other of the two of the frequency bands; and a fourth filter connected to the second filter, intercepting signals of frequencies in the one of the two of the frequency bands, and allowing signals of frequencies in the other of the two of the frequency bands to pass.

In the front end module of the invention, the reception signals in the third frequency band may be signals used for a position detecting function.

In the front end module of the invention, the transmission signals and the reception signals in each of the first and second frequency bands may be signals of a code division multiple access system.

Other and further objects, features and advantages of the invention will appear more fully from the following description.

BEST MODE FOR CARRYING OUT THE INVENTION

A preferred embodiment of the invention will now be described in detail with reference to the accompanying drawings. A front end module of the embodiment of the invention is a module for processing transmission signals and reception signals in the frequency band used in the AMPS (hereinafter called the AMPS band), transmission signals and reception signals in the frequency band used in the PCS (hereinafter called the PCS band), and reception signals of the GPS. The reception signals of the GPS are signals used for the position detecting function. The AMPS band corresponds to the first frequency band of the invention. The PCS band corresponds to the second frequency band of the invention. The frequency band of the reception signals of the GPS (hereinafter called the GPS band) corresponds to the third frequency band of the invention. According to the embodiment, each of the transmission signals and the reception signals in the AMPS band and the transmission signals and the reception signals in the PCS band are signals of the code division multiple access system.

Figure 2:
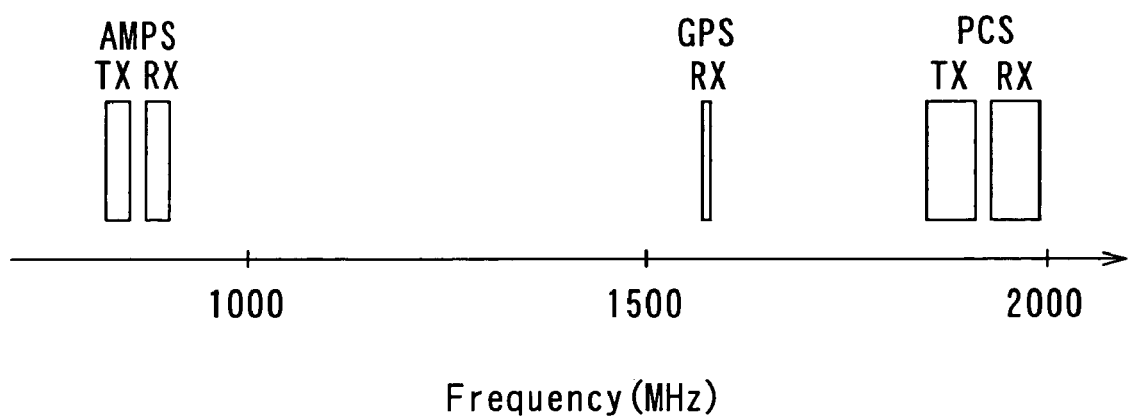
FIG. 2 is a plot showing a frequency band of signals processed by the front end module of the embodiment of the invention.

FIG. 2 shows the frequency bands of the above-mentioned transmission signals and reception signals. In FIG. 2, TX indicates the transmission signals and RX indicates the reception signals. The frequency band of transmission signals in the AMPS band is 824 to 849 MHz. The frequency band of reception signals in the AMPS band is 869 to 894 MHz. The frequency band of transmission signals in the PCS band is 1850 to 1910 MHz. The frequency band of reception signals in the PCS band is 1930 to 1990 MHz. The frequency band of reception signals of the GPS is 1574 to 1576 MHz.

Figure 1:
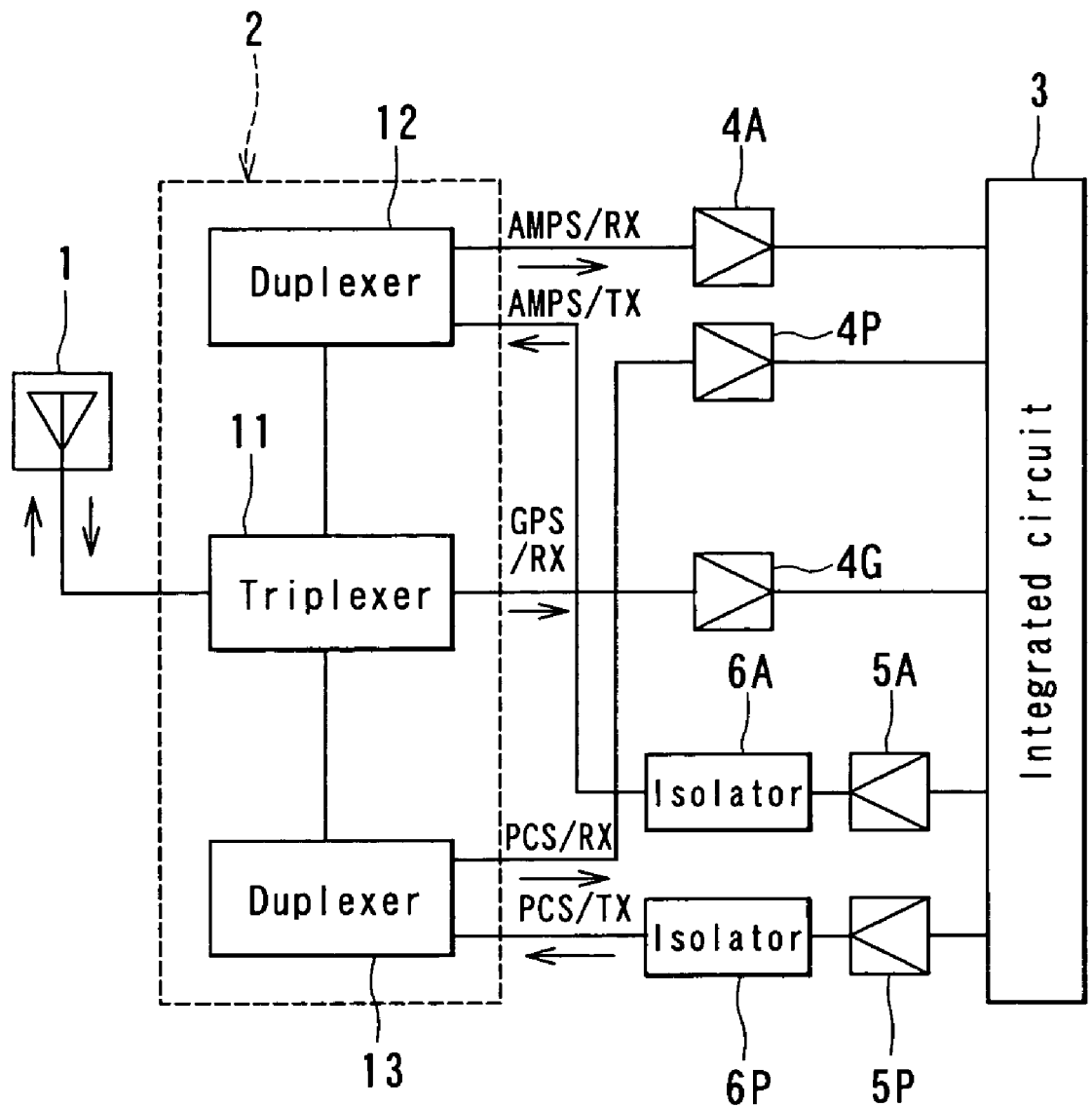
FIG. 1 is a block diagram illustrating an example of a high frequency circuit of a cellular phone including a front end module of an embodiment of the invention.

Reference is now made to FIG. 1 to describe an example of a high frequency circuit of a cellular phone including the front end module of the embodiment. The high frequency circuit of FIG. 1 comprises: an antenna 1; the front end module 2 of the embodiment connected to the antenna 1; and an integrated circuit 3 that mainly performs modulation and demodulation of signals. The high frequency circuit further comprises: three low-noise amplifiers 4A, 4P and 4G each having an input connected to the front end module 2 and having an output connected to the integrated circuit 3. The high frequency circuit further comprises: two power amplifiers 5A and 5P each having an input connected to the integrated circuit 3; an isolator 6A having an input connected to an output of the power amplifier 5A and an output connected the front end module 2; and an isolator 6P having an input connected to an output of the power amplifier 5P and an output connected to the front end module 2.

The front end module 2 comprises a triplexer 11, two duplexers 12 and 13, and a single multilayer substrate for integrating the triplexer 11 and the duplexers 12 and 13. The triplexer 11 corresponds to the first separating means of the invention. The duplexer 12 corresponds to the second separating means of the invention. The duplexer 13 corresponds to the third separating means of the invention.

The triplexer 11 has first to fourth ports. The first port is connected to the antenna 1. The second port is connected to the duplexer 12. The third port is connected to the duplexer 13. The fourth port is connected to the input of the low-noise amplifier 4G. The triplexer 11 separates the AMPS band, the PCS band and the GPS band from one another. That is, from the first port, the triplexer 11 outputs transmission signals in the AMPS band inputted to the second port, and, from the second port, outputs reception signals in the AMPS band inputted to the first port. From the first port, the triplexer 11 outputs transmission signals in the PCS band inputted to the third port, and, from the third port, outputs reception signals in the PCS band inputted to the first port. From the fourth port, the triplexer 11 outputs reception signals in the GPS band (that are indicated as GPS/RX in the drawings) inputted to the first port.

The duplexer 12 has a common terminal, a transmission terminal and a reception terminal. The common terminal is connected to the second port of the triplexer 11. The transmission terminal is connected to the output of the isolator 6A. The reception terminal is connected to the input of the low-noise amplifier 4A. The duplexer 12 separates the transmission signals (indicated as AMPS/TX in the drawings) and reception signals (indicated as AMPS/RX in the drawings) in the AMPS band from each other. That is, from the common terminal, the duplexer 12 outputs transmission signals in the AMPS band inputted to the transmission terminal, and, from the reception terminal, outputs reception signals in the AMPS band inputted to the common terminal.

The duplexer 13 has a common terminal, a transmission terminal and a reception terminal. The common terminal is connected to the third port of the triplexer 11. The transmission terminal is connected to the output of the isolator 6P. The reception terminal is connected to the input of the low-noise amplifier 4P. The duplexer 13 separates the transmission signals (indicated as PCS/TX in the drawings) and reception signals (indicated as PCS/RX in the drawings) in the PCS band from each other. That is, from the common terminal, the duplexer 13 outputs transmission signals in the PCS band inputted to the transmission terminal, and, from the reception terminal, outputs reception signals in the PCS band inputted to the common terminal.

Figure 3:
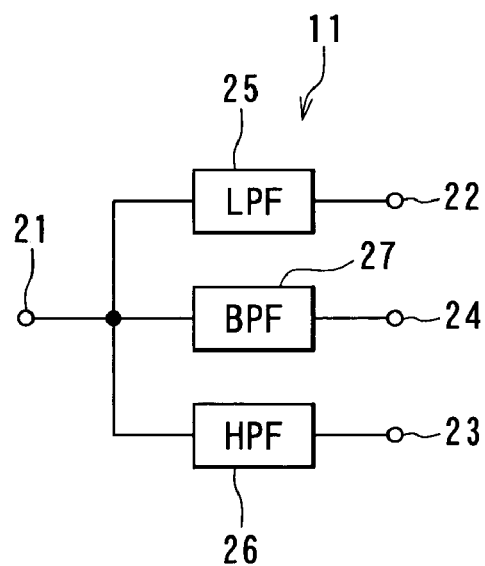
FIG. 3 is a block diagram illustrating a first example of the triplexer of FIG. 1.

Two examples of configuration of the triplexer 11 will now be described. Reference is now made to FIG. 3 to describe the configuration of the first example of the triplexer 11. The triplexer 11 of the first example incorporates first to fourth ports 21 to 24, a low-pass filter (hereinafter called an LPF) 25, a high-pass filter (hereinafter called an HPF) 26, and a band-pass filter (hereinafter called a BPF) 27. Each of the LPF 25, the HPF 26 and the BPF 27 has an end connected to the first port 21. The LPF 25 has the other end connected to the second port 22. The HPF 26 has the other end connected to the third port 23. The BPF 27 has the other end connected to the fourth port 24.

Figure 4:
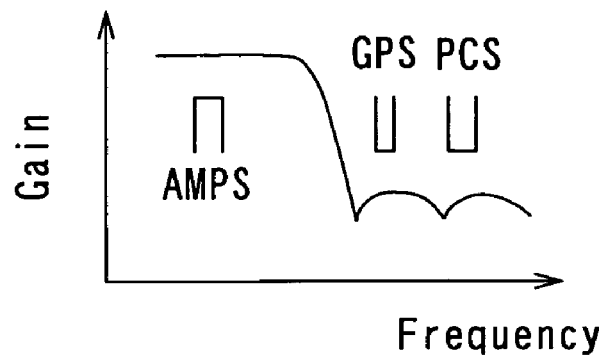
FIG. 4 is a plot showing the characteristic of the low-pass filter of FIG. 3.

FIG. 4 schematically illustrates the characteristic of the LPF 25, that is, the relationship between the frequency and the gain. As shown in FIG. 4, the LPF 25 allows the signals of the frequencies in the AMPS band to pass therethrough and intercepts the signals of the frequencies in the PCS band and the GPS band. Alternatively, in place of the LPF 25, a notch filter of high band rejection type for allowing the signals of the frequencies in the AMPS band to pass therethrough and intercepting the signals of the frequencies in the PCS band and the GPS band may be employed.

Figure 5:
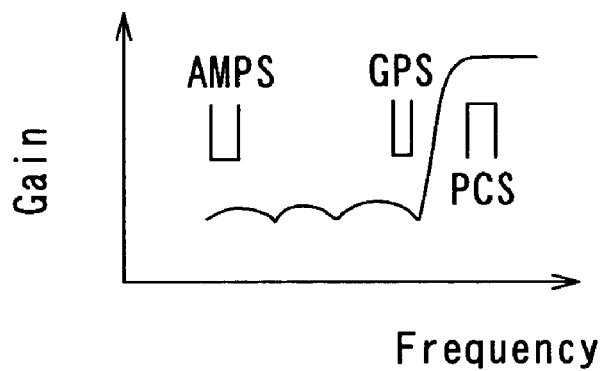
FIG. 5 is a plot showing the characteristic of the high-pass filter of FIG. 3.

FIG. 5 schematically illustrates the characteristic of the HPF 26, that is, the relationship between the frequency and the gain. As shown in FIG. 5, the HPF 26 allows the signals of the frequencies in the PCS band to pass therethrough and intercepts the signals of the frequencies in the AMPS band and the GPS band. Alternatively, in place of the HPF 26, a notch filter of low band rejection type for allowing the signals of the frequencies in the PCS band to pass therethrough and intercepting the signals of the frequencies in the AMPS band and the GPS band may be employed.

Figure 6:
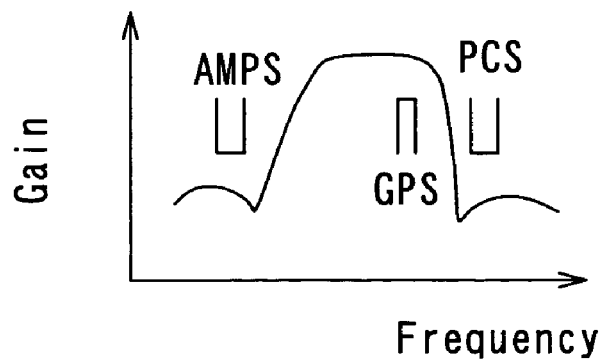
FIG. 6 is a plot showing the characteristic of the band-pass filter of FIG. 3.

FIG. 6 schematically illustrates the characteristic of the BPF 27, that is, the relationship between the frequency and the gain. As shown in FIG. 6, the BPF 27 allows the signals of the frequencies in the GPS band to pass therethrough and intercepts the signals of the frequencies in the AMPS band and the PCS band.

Figure 7:
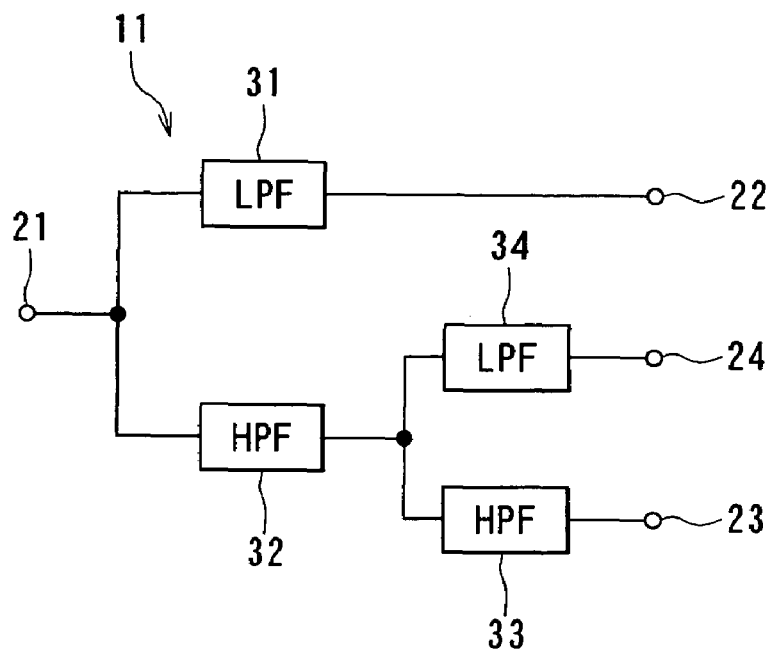
FIG. 7 is a block diagram illustrating a second example of the triplexer of FIG. 1.

Reference is now made to FIG. 7 to describe the second example of configuration of the triplexer 11. The triplexer 11 of the second example incorporates: the first to fourth ports 21 to 24; an LPF 31 having an end connected to the first port 21 and the other end connected to the second port 22; and an HPF 32 having an end connected to the first port 21. The triplexer 11 of the second example further incorporates: an HPF 33 having an end connected to the other end of the HPF 32 and having the other end connected to the third port 23; and an LPF 34 having an end connected to the other end of the HPF 32 and having the other end connected to the fourth port 24.

Figure 8:
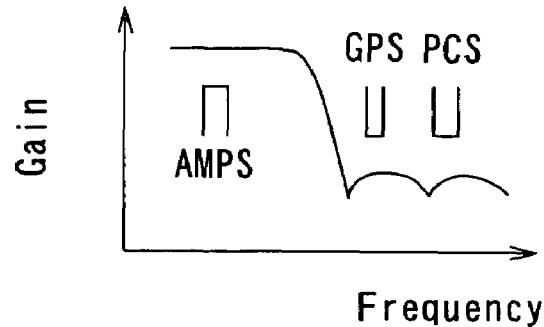
FIG. 8 is a plot showing the characteristic of the low-pass filter connected to the first port of FIG. 7.

FIG. 8 schematically illustrates the characteristic of the LPF 31, that is, the relationship between the frequency and the gain. As shown in FIG. 8, the LPF 31 allows the signals of the frequencies in the AMPS band to pass therethrough and intercepts the signals of the frequencies in the PCS band and the GPS band. Alternatively, in place of the LPF 31, a notch filter of high band rejection type for allowing the signals of the frequencies in the AMPS band to pass therethrough and intercepting the signals of the frequencies in the PCS band and the GPS band may be employed.

Figure 9:
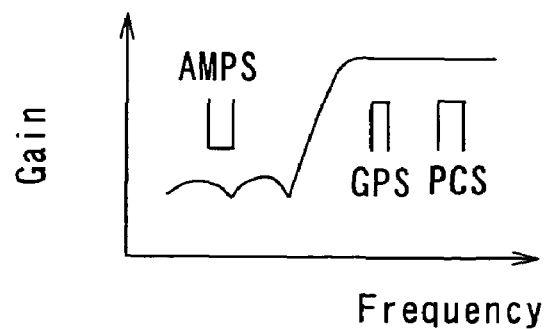
FIG. 9 is a plot showing the characteristic of the high-pass filter connected to the first port of FIG. 7.

FIG. 9 schematically illustrates the characteristic of the HPF 32, that is, the relationship between the frequency and the gain. As shown in FIG. 9, the HPF 32 allows the signals of the frequencies in the PCS band and the GPS band to pass therethrough and intercepts the signals of the frequencies in the AMPS band. Alternatively, in place of the HPF 32, a notch filter of low band rejection type for allowing the signals of the frequencies in the PCS band and the GPS band to pass therethrough and intercepting the signals of the frequencies in the AMPS band may be employed.

Figure 10:
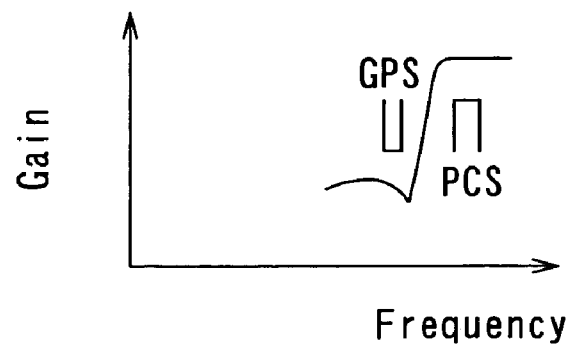
FIG. 10 is a plot showing the characteristic of the high-pass filter connected to the third port of FIG. 7.

FIG. 10 schematically illustrates the characteristic of the HPF 33, that is, the relationship between the frequency and the gain. As shown in FIG. 10, the HPF 33 allows the signals of the frequencies in the PCS band to pass therethrough and intercepts the signals of the frequencies in the GPS band. Alternatively, in place of the HPF 33, a notch filter of low band rejection type for allowing the signals of the frequencies in the PCS band to pass therethrough and intercepting the signals of the frequencies in the GPS band may be employed.

Figure 11:
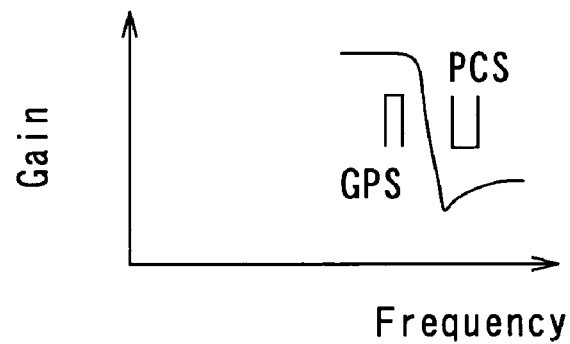
FIG. 11 is a plot showing the characteristic of the low-pass filter connected to the fourth port of FIG. 7.

FIG. 11 schematically illustrates the characteristic of the LPF 34, that is, the relationship between the frequency and the gain. As shown in FIG. 11, the LPF 34 allows the signals of the frequencies in the GPS band to pass therethrough and intercepts the signals of the frequencies in the PCS band. Alternatively, in place of the LPF 34, a notch filter of high band rejection type for allowing the signals of the frequencies in the GPS band to pass therethrough and intercepting the signals of the frequencies in the PCS band may be employed.

Reference is now made to FIG. 12 to FIG. 16 to describe examples of configurations of the filters used in the triplexer 11.

Figure 12:
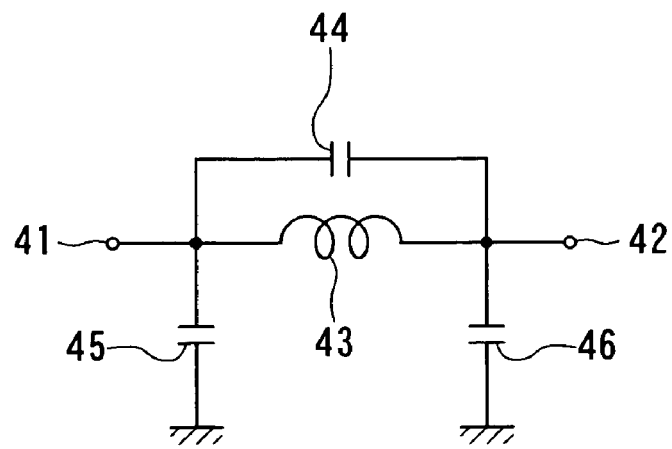
FIG. 12 is a schematic diagram illustrating an example of configuration of the low-pass filter incorporated in the triplexer of FIG. 3 or FIG. 7.

FIG. 12 is a schematic diagram illustrating an example of configuration of an LPF that is used as the LPFs 25, 31 and 34. The LPF has two terminals 41 and 42, an inductor 43 and three capacitors 44 to 46. The inductor 43 has an end connected to the terminal 41 and the other end connected to the terminal 42. The capacitor 44 has an end connected to the terminal 41 and the other end connected to the terminal 42. The capacitor 45 has an end connected to the terminal 41 and the other end grounded. The capacitor 46 has an end connected to the terminal 42 and the other end grounded.

Figure 13:
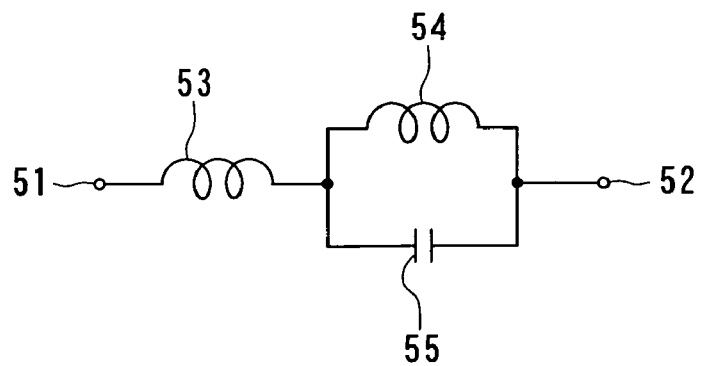
FIG. 13 is a schematic diagram illustrating an example of configuration of a notch filter of high band rejection type that can be used in place of the low-pass filter of FIG. 12.

FIG. 13 is a schematic diagram illustrating an example of configuration of a notch filter of high band rejection type that can be used in place of the LPF of FIG. 12. The notch filter has two terminals 51 and 52, two inductors 53 and 54, and a capacitor 55. The inductor 53 has an end connected to the terminal 51. The inductor 54 has an end connected to the other end of the inductor 53 and has the other end connected to the terminal 52. The capacitor 55 has an end connected to the other end of the inductor 53 and has the other end connected to the terminal 52.

Figure 14:
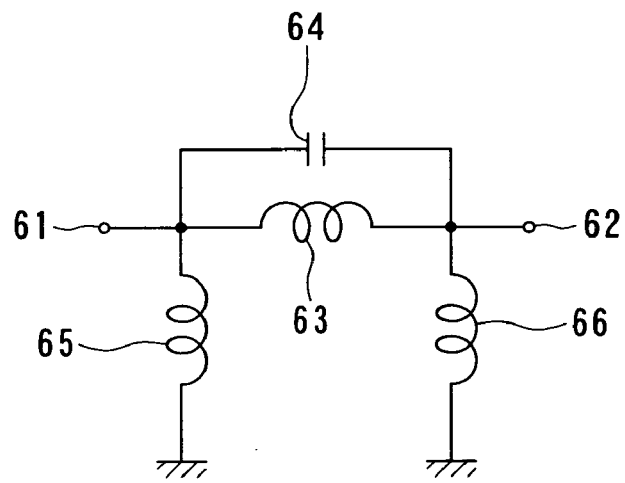
FIG. 14 is a schematic diagram illustrating an example of configuration of the high-pass filter incorporated in the triplexer of FIG. 3 or FIG. 7.

FIG. 14 is a schematic diagram illustrating an example of configuration of an HPF used as the HPFs 26, 32 and 33. The HPF has two terminals 61 and 62, three inductors 63, 65 and 66, and a capacitor 64. The inductor 63 has an end connected to the terminal 61 and the other end connected to the terminal 62. The capacitor 64 has an end connected to the terminal 61 and the other end connected to the terminal 62. The inductor 65 has an end connected to the terminal 61 and the other end grounded. The inductor 66 has an end connected to the terminal 62 and the other end grounded.

Figure 15:
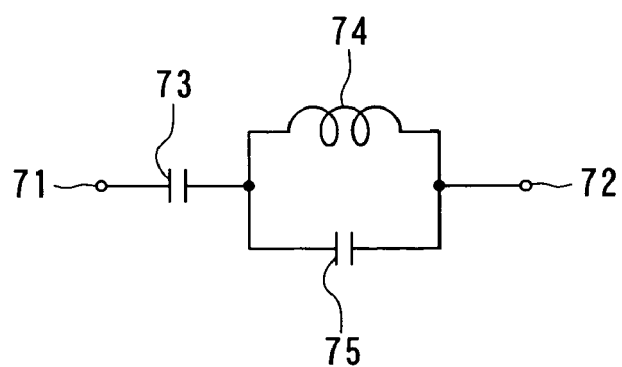
FIG. 15 is a schematic diagram illustrating an example of configuration of a notch filter of low band rejection type that can be used in place of the high-pass filter of FIG. 14.

FIG. 15 is a schematic diagram illustrating an example of configuration of a notch filter of low band rejection type that can be used in place of the HPF of FIG. 14. The notch filter has two terminals 71 and 72, two capacitors 73 and 75, and an inductor 74. The capacitor 73 has an end connected to the terminal 71. The inductor 74 has an end connected to the other end of the capacitor 73 and has the other end connected to the terminal 72. The capacitor 75 has an end connected to the other end of the capacitor 73 and has the other end connected to the terminal 72.

Figure 16:
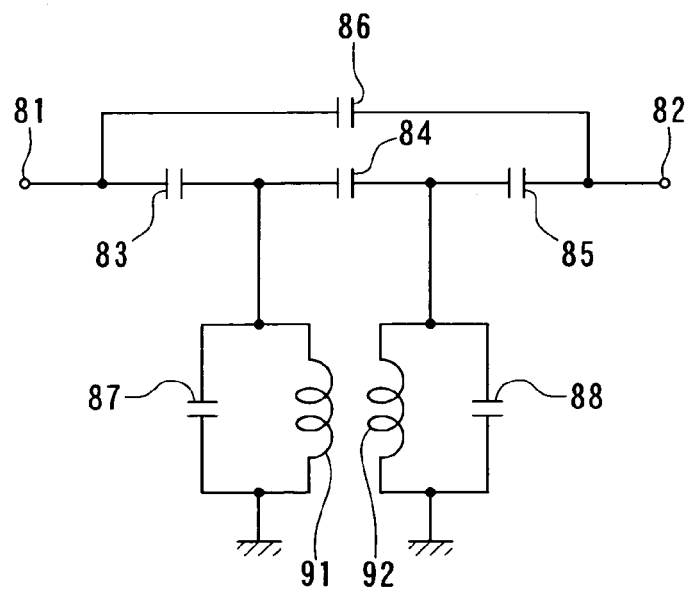
FIG. 16 is a schematic diagram illustrating an example of configuration of the band-pass filter incorporated in the triplexer of FIG. 3.

FIG. 16 is a schematic diagram illustrating an example of configuration of a BPF used as the BPF 27. The BPF has two terminals 81 and 82, six capacitors 83 to 88, and two inductors 91 and 92. The capacitor 83 has an end connected to the terminal 81. The capacitor 84 has an end connected to the other end of the capacitor 83. The capacitor 85 has an end connected to the other end of the capacitor 84 and has the other end connected to the terminal 82. The capacitor 86 has an end connected to the terminal 81 and the other end connected to the terminal 82. The capacitor 87 has an end connected to the node between the capacitors 83 and 84 and has the other end grounded. The capacitor 88 has an end connected to the node between the capacitors 84 and 85 and the other end grounded. The inductor 91 has an end connected to one of the ends of the capacitor 87 and has the other end grounded. The inductor 92 has an end connected to one of the ends of the capacitor 88 and has the other end grounded.

Figure 17:
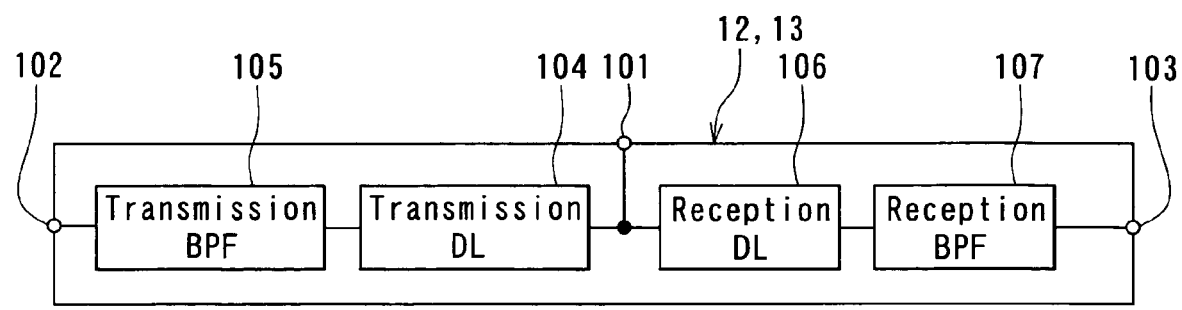
FIG. 17 is a block diagram illustrating an example of configuration of the duplexer of FIG. 1.

Reference is now made to FIG. 17 to describe an example of circuit configuration of the duplexers 12 and 13. The duplexer 12 or 13 of FIG. 17 incorporates a common terminal 101, a transmission terminal 102 and a reception terminal 103. The common terminal 101 is connected to the triplexer 11. The transmission terminal 102 is connected to the isolator 6A or the isolator 6P. The reception terminal 103 is connected to the low-noise amplifier 4A or the low-noise amplifier 4P.

The duplexer 12 or 13 further incorporates: a transmission-side delay line (indicated as transmission DL in FIG. 17) 104 having an end connected to the common terminal 101; and a transmission-side BPF 105 having an output connected to the other end of the delay line 104 and an input connected to the transmission terminal 102. The duplexer 12 or 13 further incorporates: a reception-side delay line (indicated as reception DL in FIG. 17) 106 having an end connected to the common terminal 101; and a reception-side BPF 107 having an input connected to the other end of the delay line 106 and an output connected to the reception terminal 103. Each of the BPFs 105 and 107 is made up of an acoustic wave element.

The transmission-side delay line 104 and the reception-side delay line 106 are adjusted such that the impedance described below is obtained when the duplexer 12 or 13 is seen from each of the terminals 101, 102 and 103. When the duplexer 12 or 13 is seen from the common terminal 101, the impedance is nearly 50 ohms in the frequency band of the transmission signal and the frequency band of the reception signal. When the duplexer 12 or 13 is seen from the transmission terminal 102, the impedance is nearly 50 ohms in the frequency band of the transmission signal, and the impedance is sufficiently high in the frequency band of the reception signal. When the duplexer 12 or 13 is seen from the reception terminal 103, the impedance is nearly 50 ohms in the frequency band of the reception signal, and the impedance is sufficiently high in the frequency band of the transmission signal. Depending on the configurations of the BPFs 105 and 107, one of the transmission-side delay line 104 and the reception-side delay line 106 may be only provided in some cases.

To implement the above-described relationship of the impedances, a matching circuit may be provided, if necessary, between each of the common terminal 101, the transmission terminal 102 and the reception terminal 103 of the duplexer 12 or 13 and an external circuit connected thereto.

Figure 18:
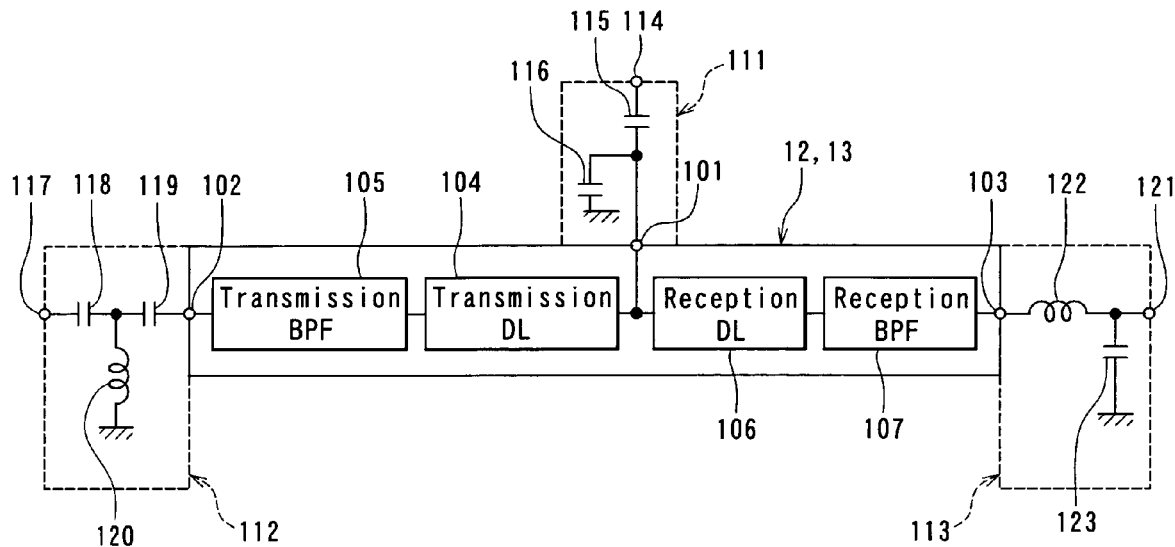
FIG. 18 is a schematic diagram illustrating an example of configuration of the duplexer of FIG. 1 and a matching circuit connected thereto.

FIG. 18 is a schematic diagram illustrating an example of circuit configuration of the duplexer 12 or 13 and the matching circuits connected thereto. The duplexer 12 or 13 of the example shown in FIG. 18 has a configuration the same as that of the duplexer 12 or 13 of FIG. 17. In the example shown in FIG. 18, the matching circuit 111 is connected to the common terminal 101, the matching circuit 112 is connected to the transmission terminal 102, and the matching circuit 113 is connected to the reception terminal 103. The matching circuits 111, 112 and 113 are included in the front end module 2.

The matching circuit 111 has a terminal 114 and two capacitors 115 and 116. The terminal 114 is connected to the triplexer 11. The capacitor 115 has an end connected to the terminal 114 and the other end connected to the common terminal 101. The capacitor 116 has an end connected to the common terminal 101 and the other end grounded.

The matching circuit 112 has a terminal 117, two capacitors 118 and 119, and an inductor 120. The capacitor 118 has an end connected to the terminal 117. The capacitor 119 has an end connected to the other end of the capacitor 118 and has the other end connected to the transmission terminal 102. The inductor 120 has an end connected to the other end of the capacitor 118 and has the other end grounded.

The matching circuit 113 has a terminal 121, an inductor 122 and a capacitor 123. The inductor 122 has an end connected to the reception terminal 103 and the other end connected to the terminal 121. The capacitor 123 has an end connected to the terminal 121 and the other end grounded.

Figure 19:
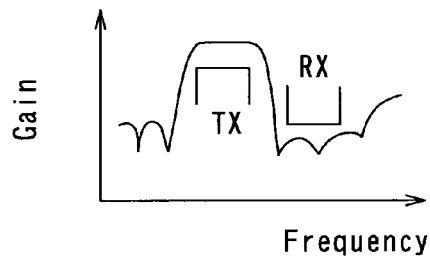
FIG. 19 is a plot showing the characteristic of the transmission-side band-pass filter of FIG. 17 or FIG. 18.

FIG. 19 schematically illustrates the characteristic of the transmission-side BPF 105 of the duplexer 12 or 13, that is, the relationship between the frequency and the gain. As shown in FIG. 19, the BPF 105 allows transmission signals (indicated as TX in FIG. 19) to pass therethrough and intercepts the reception signals (indicated as RX in FIG. 19).

Figure 20:
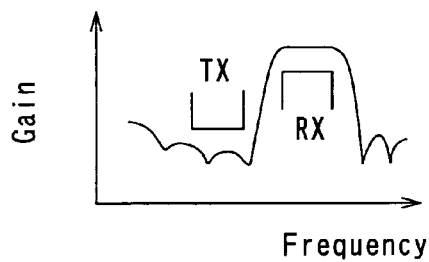
FIG. 20 is a plot showing the characteristic of the reception-side band-pass filter of FIG. 17 or FIG. 18.

FIG. 20 schematically illustrates the characteristic of the reception-side BPF 107 of the duplexer 12 or 13, that is, the relationship between the frequency and the gain. As shown in FIG. 20, the BPF 107 allows reception signals (indicated as RX in FIG. 20) to pass therethrough and intercepts the transmission signals (indicated as TX in FIG. 20).

Figure 21:
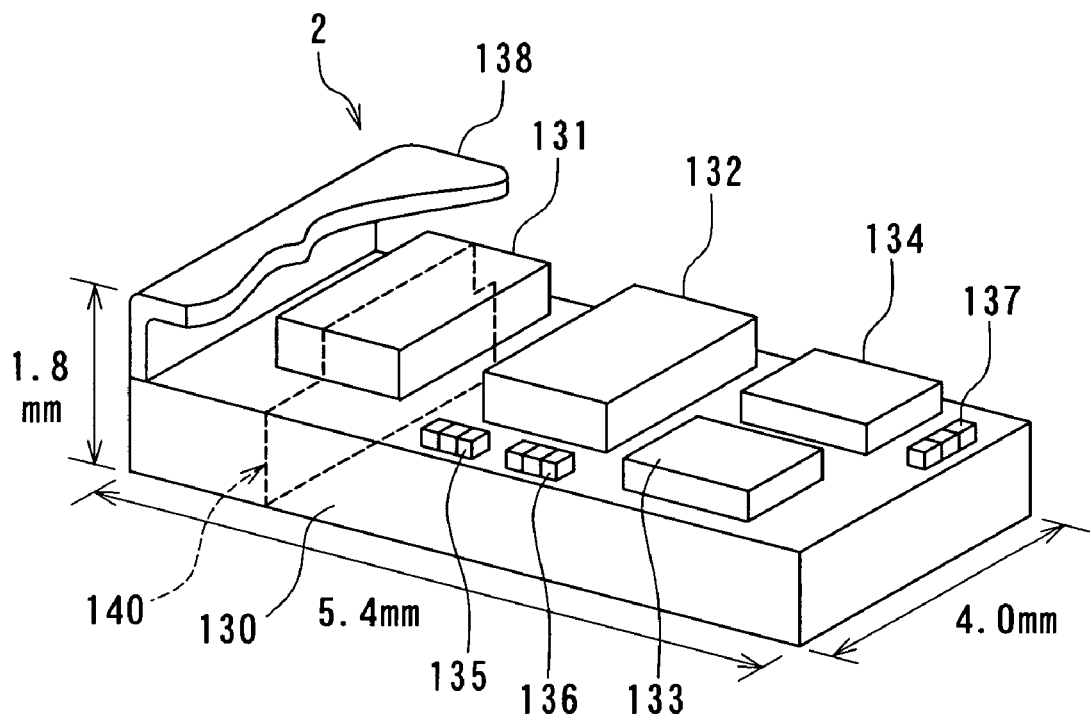
FIG. 21 is a perspective view illustrating an example of appearance of the front end module of the embodiment of the invention.

Reference is now made to FIG. 21 to FIG. 24 to describe the structure of the front end module 2. FIG. 21 is a perspective view illustrating an example of appearance of the front end module 2. As shown in FIG. 21, the front end module 2 comprises a single multilayer substrate 130 for integration. The multilayer substrate 130 is used to integrate the triplexer 11 and the two duplexers 12 and 13. The multilayer substrate 130 has a structure in which dielectric layers and patterned conductor layers are alternately stacked. The multilayer substrate 130 may be a multilayer low-temperature co-fired ceramic substrate, for example. The circuits of the front end module 2 are made up of the conductor layers located inside or on the surface of the multilayer substrate 130 and the components mounted on the multilayer substrate 130. In particular, the triplexer 11 is made up of the conductor layers located inside or on the surface of the multilayer substrate 130.

As shown in FIG. 17, each of the duplexers 12 and 13 has the two BPFs 105 and 107 each of which is made up of an acoustic wave element. BPFs made up of dielectric resonators have been utilized for a long time. However, the BPFs made up of dielectric resonators are large and heavy so that they are not suitable for reducing the size and weight of a front end module. According to the embodiment, the duplexers 12 and 13 have the BPFs 105 and 107 each of which is made up of an acoustic wave element, so that it is possible to reduce the front end module 2 including the BPFs 105 and 107 in size and weight.

Although surface acoustic wave elements are employed as acoustic wave elements in the examples herein described, it is possible to use bulk acoustic wave elements in place of the surface acoustic wave elements. While the surface acoustic wave elements utilize acoustic waves (surface acoustic waves) that propagate across the surface of a piezoelectric material, the bulk acoustic wave elements utilize acoustic waves (bulk acoustic waves) that propagate inside a piezoelectric material. Some of the bulk acoustic wave elements made of piezoelectric thin films in particular are called thin-film bulk acoustic wave elements. Resonators made of piezoelectric thin films in particular are called film bulk acoustic resonators (FBAR). The above-mentioned thin-film bulk acoustic wave elements may be used as the above-mentioned acoustic wave elements. The thin-film bulk acoustic wave elements have a temperature characteristic better than that of the surface acoustic wave elements. Typically, the thin-film bulk acoustic wave elements have a temperature characteristic of around 20 ppm/° C. while the surface acoustic wave elements have a temperature characteristic of around 40 ppm/° C. Therefore, the thin-film bulk acoustic wave elements are suitable for achieving a steep frequency characteristic required for the filters.

In FIG. 21, numerals 131 and 132 indicate chips including the surface acoustic wave elements used in the BPFs 105 and 107 of the duplexer 12. Numerals 133 and 134 indicate chips including the surface acoustic wave elements used in the BPFs 105 and 107 of the duplexer 13. The chips 131 to 134 are mounted on the top surface of the multilayer substrate 130. At least part of the circuit portion of the duplexers 12 and 13 except the surface acoustic wave elements is made up of the conductor layers located inside or on the surface of the multilayer substrate 130. FIG. 21 shows an example in which part of the circuit portion of the duplexer 12 or 13 except the surface acoustic wave elements is made up of chip components 135 to 137 mounted on the top surface of the multilayer substrate 130, and the remainder of the circuit portion of the duplexer 12 or 13 except the surface acoustic wave elements is made up of the conductor layers located inside or on the surface of the multilayer substrate 130. However, it is possible that the circuit portion of the duplexer 12 or 13 except the surface acoustic wave elements is entirely made up of inductors and capacitors, so that the entire circuit portion of the duplexer 12 or 13 except the surface acoustic wave elements may be made up of the conductor layers located inside or on the surface of the multilayer substrate 130.

The top surface of the multilayer substrate 130, and the chips 131 to 134 and the chip components 135 to 137 mounted on the top surface are covered with a shield case 138.

Figure 22:
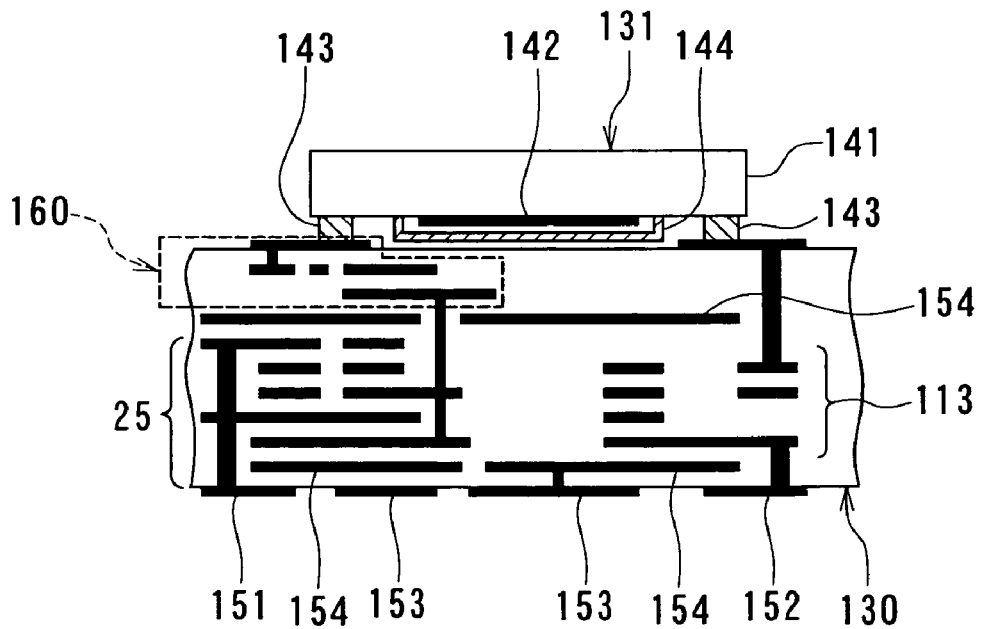
FIG. 22 is a cross-sectional view of the front end module of FIG. 21.

FIG. 22 illustrates a cross section indicated with 140 in FIG. 21. As shown in FIG. 22, the chip 131 has: a piezoelectric substrate 141 made of a piezoelectric material such as LiTaO$_3$; an inter-digital electrode 142 formed on one of the surfaces of the piezoelectric substrate 141; a connecting electrode 143 for connecting the inter-digital electrode 142 to an external circuit; and a cover 144 for covering the inter-digital electrode 142. The connecting electrode 143 is disposed in the same plane as the inter-digital electrode 142. A space is created between the inter-digital electrode 142 and the cover 144. The chip 131 is mounted on the top surface of the multilayer substrate 130 by flip-chip bonding so that the inter-digital electrode 142 faces toward the top surface of the multilayer substrate 130. The structure and the mounting method of each of the chips 132 to 134 are the same as those of the chip 131.

In FIG. 22, numeral 151 indicates an antenna terminal connected to the antenna 1, numeral 152 indicates an output terminal for outputting reception signals in the AMPS band, and numeral 153 indicates a ground terminal. The terminals 151 to 153 are located on the bottom surface of the multilayer substrate 130. Numeral 154 indicates a ground layer disposed inside the multilayer substrate 130. The ground layer 154 is connected to the ground terminal 153.

Figure 23:
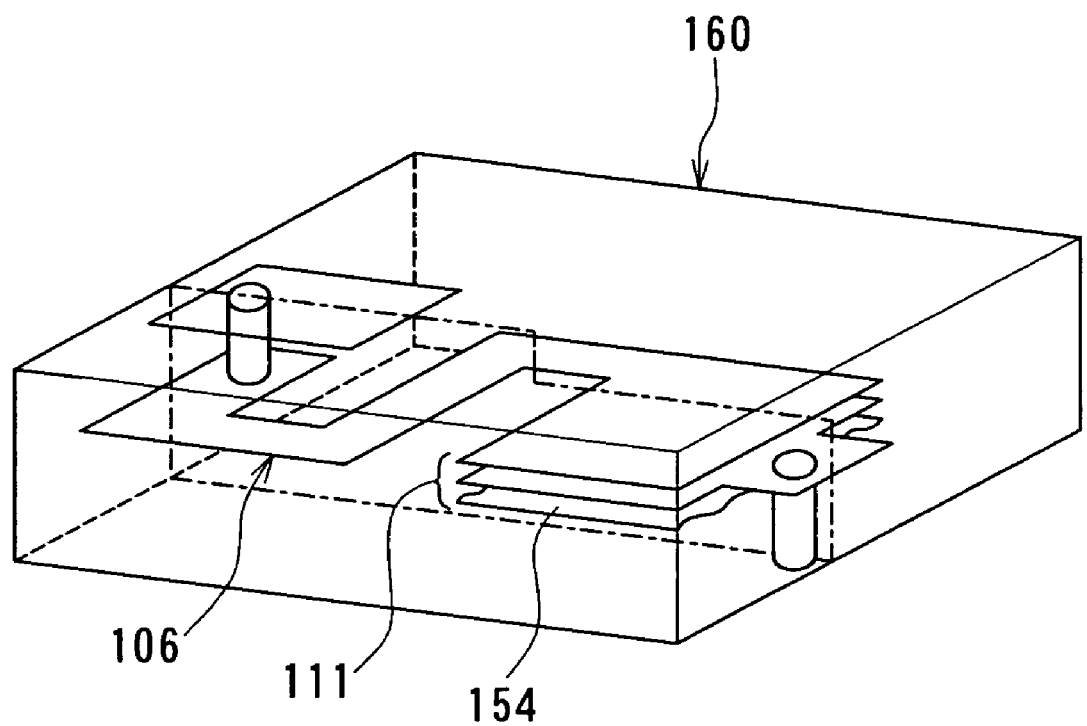
FIG. 23 is a perspective view illustrating a part of FIG. 22.

In the example shown in FIG. 22, the chip 131 is designed to make up the reception-side BPF 107 of the duplexer 12. FIG. 22 shows the LPF 25 (having a configuration shown in FIG. 12) of the triplexer 11 having a configuration shown in FIG. 3, the matching circuit 111 of FIG. 18, the reception-side delay line 106 of FIG. 18, and the matching circuit 113 of FIG. 18 as an example of the circuit portion formed inside the multilayer substrate 130. FIG. 23 is a perspective view of the portion indicated with numeral 160 in FIG. 22, that is, the matching circuit 111 and the delay line 106.

Figure 24:
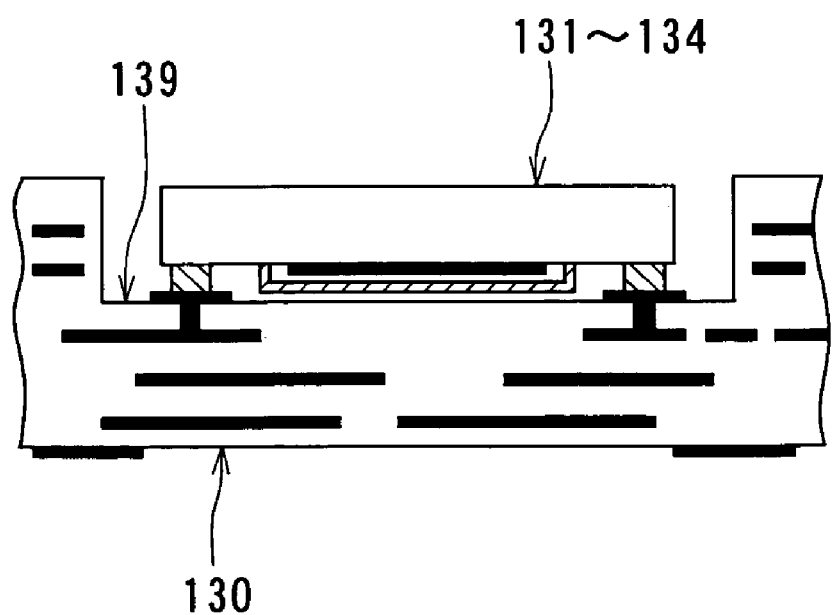
FIG. 24 is a cross-sectional view illustrating another example of configuration of the front end module of the embodiment of the invention.

In the example shown in FIG. 21, the multilayer substrate 130 has a flat top surface on which the chips 131 to 134 are mounted. In another example, as shown in FIG. 24, four concave portions 139 for accommodating the chips 131 to 134 may be formed in the top surface of the multilayer substrate 130, and the chips 131 to 134 may be disposed in the respective concave portions 139.

The front end module 2 of FIG. 21 has a length of 5.4 mm, a width of 4.0 mm and a height of 1.8 mm, for example.

Reference is now made to FIG. 25 to FIG. 30 to describe a first reference front end module compared with the front end module 2 of the embodiment of the invention. First, reference is made to FIG. 25 to describe an example of a high frequency circuit of a cellular phone including the first reference front end module. The high frequency circuit of FIG. 25 comprises two antennas 201A and 201B and the front end module 202 connected to the antennas 201A and 201B. The antenna 201A is used for transmission and reception of signals in the AMPS band and the PCS band. The antenna 201B is used for reception of reception signals of the GPS.

Figure 25:
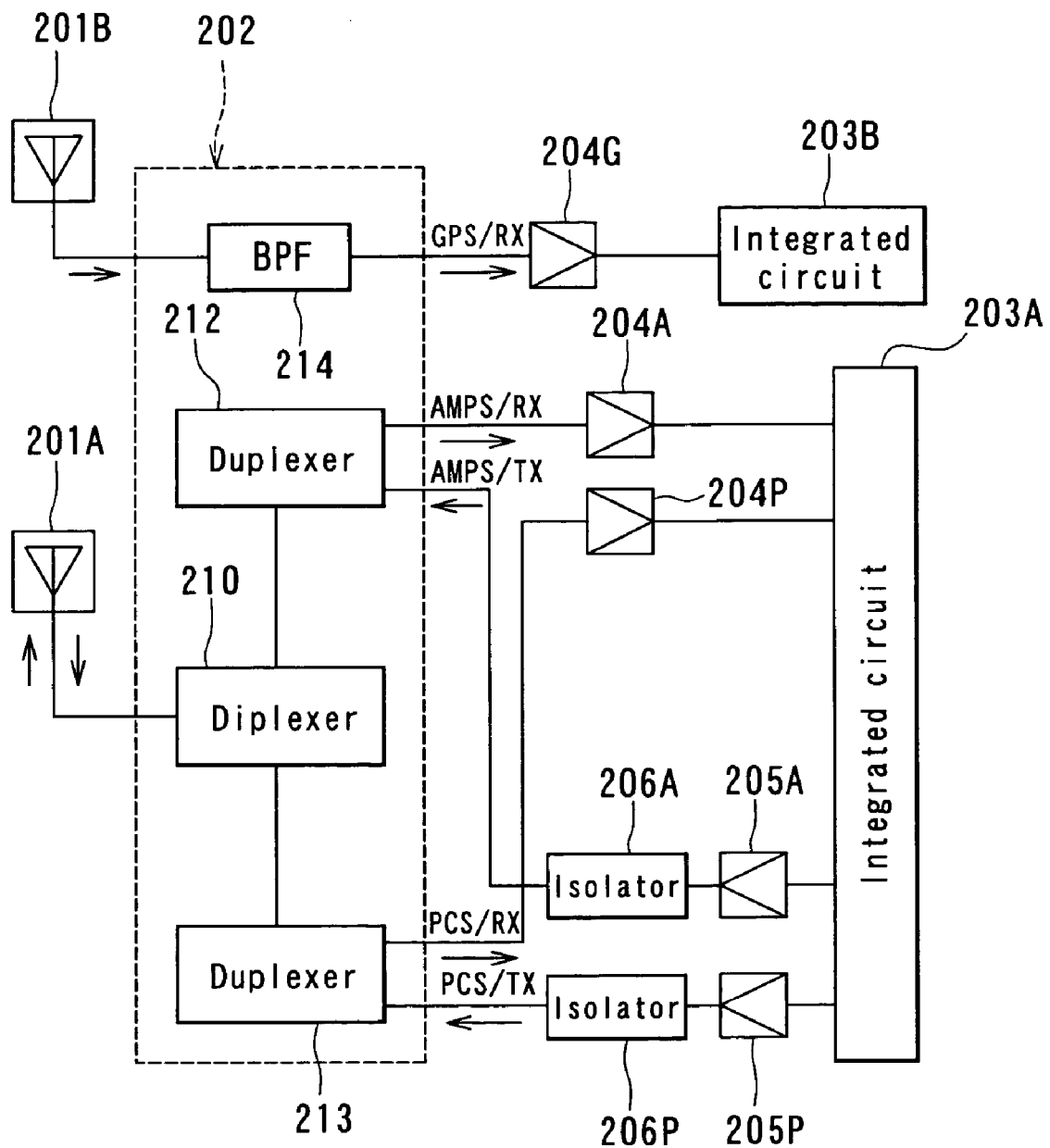
FIG. 25 is a block diagram illustrating an example of high frequency circuit of a cellular phone including a first reference front end module.

The high frequency circuit of FIG. 25 further comprises an integrated circuit 203A that mainly performs modulation and demodulation of signals in the AMPS band and the PCS band, and an integrated circuit 203B that mainly performs demodulation of reception signals of the GPS. The high frequency circuit further comprises: two low-noise amplifiers 204A and 204P each having an input connected to the front end module 202 and an output connected to the integrated circuit 203A; and a low-noise amplifier 204G having an input connected to the front end module 202 and an output connected to the integrated circuit 203B. The high frequency circuit further comprises: two power amplifiers 205A and 205P each having an input connected to the integrated circuit 203A; an isolator 206A having an input connected to an output of the power amplifier 205A and having an output connected the front end module 202; and an isolator 206P having an input connected to an output of the power amplifier 205P and having an output connected to the front end module 202.

The front end module 202 comprises a diplexer 210, two duplexers 212 and 213, and a BPF 214. The diplexer 210 has first to third ports. The first port is connected to the antenna 201A. The second port is connected to the duplexer 212. The third port is connected to the duplexer 213. The diplexer 210 separates the AMPS band and the PCS band from each other. That is, from the first port, the diplexer 210 outputs transmission signals in the AMPS band inputted to the second port, and, from the second port, outputs reception signals in the AMPS band inputted to the first port. From the first port the diplexer 210 outputs transmission signals in the PCS band inputted to the third port, and, from the third port, outputs reception signals in the PCS band inputted to the first port.

The duplexer 212 has a common terminal, a transmission terminal and a reception terminal. The common terminal is connected to the second port of the diplexer 210. The transmission terminal is connected to the output of the isolator 206A. The reception terminal is connected to the input of the low-noise amplifier 204A. The duplexer 212 separates transmission signals (indicated as AMPS/TX in the drawings) and reception signals (indicated as AMPS/RX in the drawings) in the AMPS band from each other. That is, from the common terminal, the duplexer 212 outputs transmission signals in the AMPS band inputted to the transmission terminal, and, from the reception terminal, outputs reception signals in the AMPS band inputted to the common terminal.

The duplexer 213 has a common terminal, a transmission terminal and a reception terminal. The common terminal is connected to the third port of the diplexer 210. The transmission terminal is connected to the output of the isolator 206P. The reception terminal is connected to the input of the low-noise amplifier 204P. The duplexer 213 separates transmission signals (indicated as PCS/TX in the drawings) and reception signals (indicated as PCS/RX in the drawings) in the PCS band from each other. That is, from the common terminal, the duplexer 213 outputs transmission signals in the PCS band inputted to the transmission terminal, and, from the reception terminal, outputs reception signals in the PCS band inputted to the common terminal.

The BPF 214 has an input connected to the antenna 201B and an output connected to the input of the low-noise amplifier 204G. The BPF 214 selectively allows reception signals (indicated as GPS/RX in the drawings) of the GPS received at the antenna 201B to pass therethrough.

The diplexer 210 has a circuit configuration obtained by excluding the BPF 27 and the fourth port 24 from the configuration of the triplexer 11 of FIG. 3. The circuit configuration of the duplexers 212 and 213 is the same as that of the duplexers 12 and 13 of the embodiment.

The first reference front end module 202 has a configuration in which the diplexer 210, the two duplexers 212 and 213, and the BPF 214 are discrete components and they are mounted on a motherboard by a method such as soldering.

Figure 26:
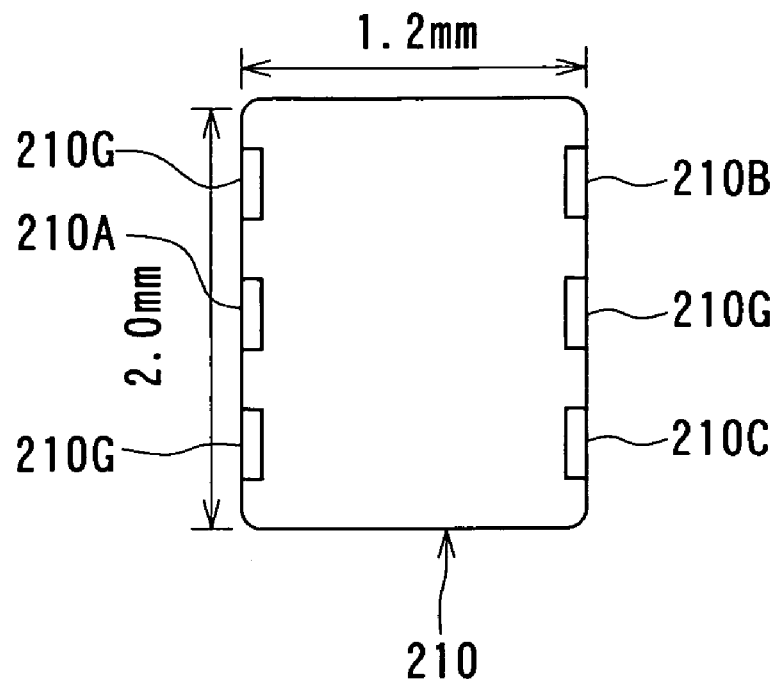
FIG. 26 is a top view illustrating an example of appearance of the diplexer of FIG. 25.

FIG. 26 is a top view illustrating an example of appearance of the diplexer 210. The diplexer 210 of FIG. 26 has terminals 210A, 210B and 210C corresponding to the first to third ports, and three ground terminals 210G. In the example shown in FIG. 26, the diplexer 210 has a length of 2.0 mm and a width of 1.2 mm.

Figure 27:
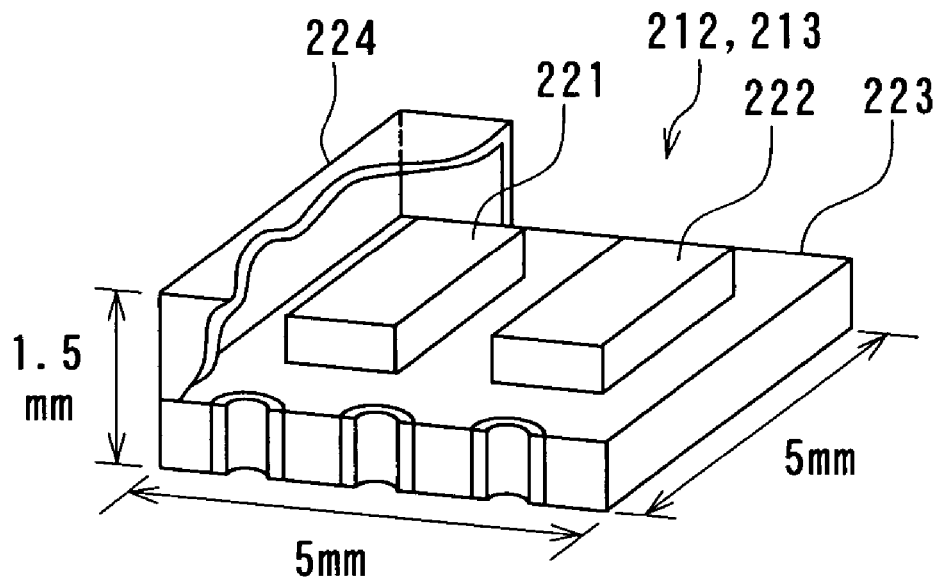
FIG. 27 is a perspective view illustrating an example of appearance of the duplexer of FIG. 25.

FIG. 27 is a perspective view illustrating an example of appearance of the duplexer 212 or 213. The duplexer 212 or 213 of FIG. 27 has: two chips 221 and 222 each of which includes a surface acoustic wave element used in a BPF; a mounting board 223 on which the two chips 221 and 222 are mounted; and a shield case 224 for covering the chips 221 and 222. The mounting board 223 is a multilayer substrate. In the example shown in FIG. 27, the duplexer 212 or 213 has a length of 5 mm, a width of 5 mm and a height of 1.5 mm.

Figure 28:
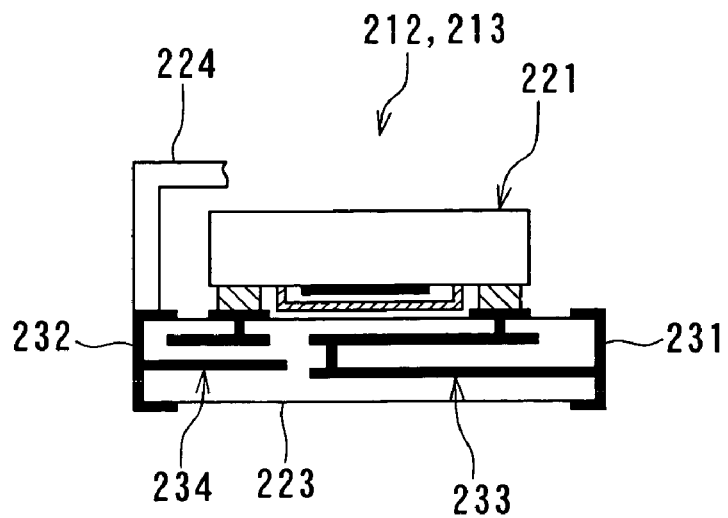
FIG. 28 is a cross-sectional view of the duplexer of FIG. 27.

FIG. 28 illustrates a cross section passing through the chip 221 of FIG. 27. The chip 221 of FIG. 28 has a structure the same as that of the chip 131 of FIG. 22. FIG. 28 shows a common terminal 231, a reception terminal 232, a reception-side delay line 233 and a matching circuit 234. The delay line 233 and the matching circuit 234 are made up of the conductor layers located inside or on the surface of the mounting board 223.

Figure 29:
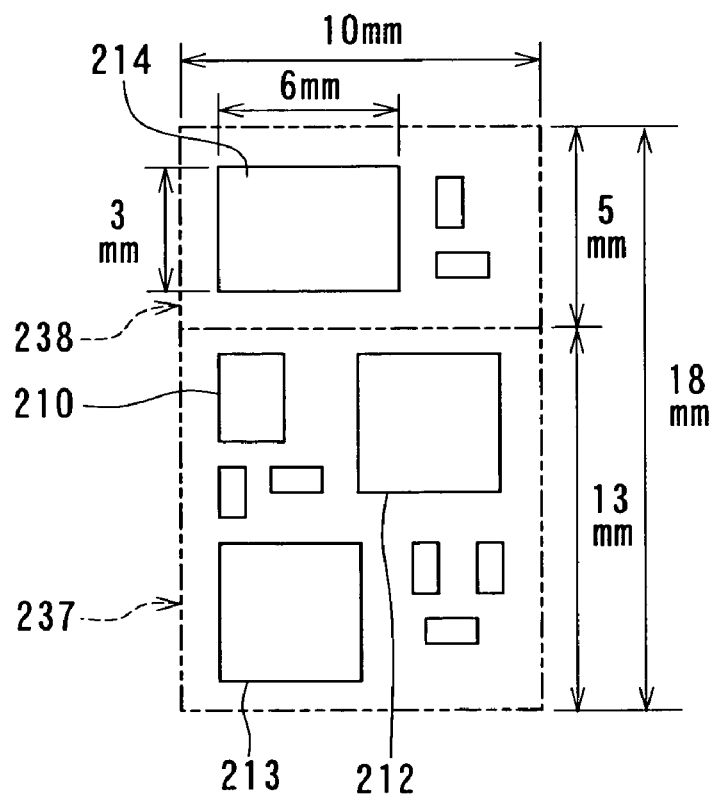
FIG. 29 is a top view illustrating an example of arrangement of the components of the first reference front end module.
Figure 30:
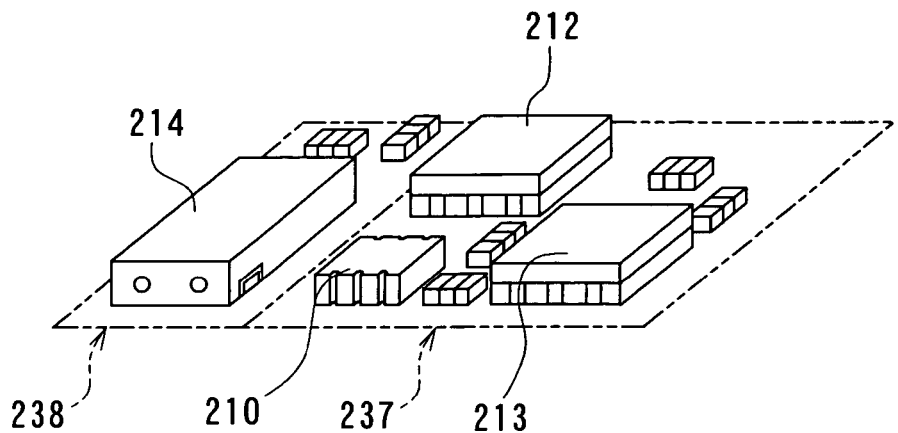
FIG. 30 is a perspective view illustrating the example of arrangement of the components of the first reference front end module.

FIG. 29 is a top view illustrating an example of arrangement of the components of the first reference front end module. FIG. 30 is a perspective view illustrating this example of arrangement. In this example a first region 237 and a second region 238 are provided on the motherboard. In the first region 237, the diplexer 210, the duplexers 212 and 213, and the periphery circuits are disposed. In the second region 238, the BPF 214 and the periphery circuits are disposed. In this example the BPF 214 has a length of 3 mm and a width of 6 mm. In the example, the first region 237 has a length of 13 mm and a width of 10 mm, and the second region 238 has a length of 5 mm and a width of 10 mm.

Figure 31:
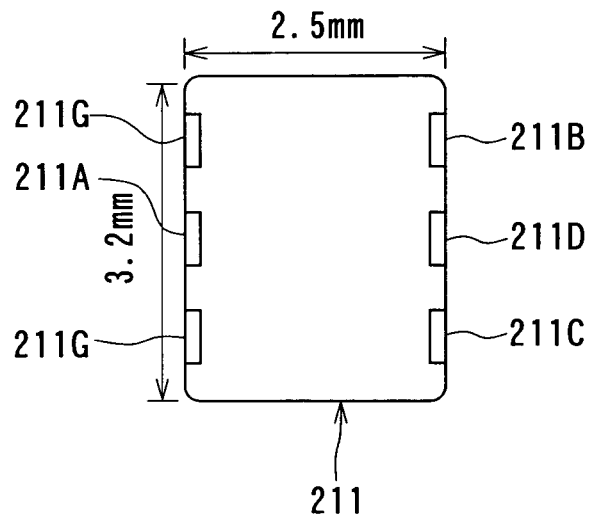
FIG. 31 is a top view illustrating an example of appearance of a triplexer of a second reference front end module.
Figure 32:
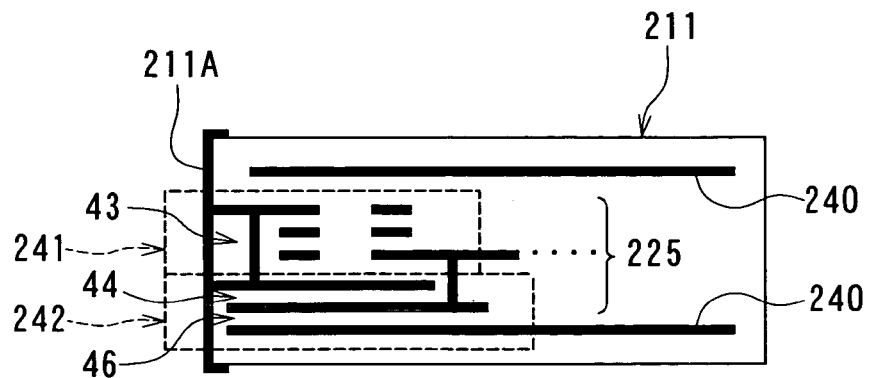
FIG. 32 is a cross-sectional view of the triplexer of FIG. 31.
Figure 33:
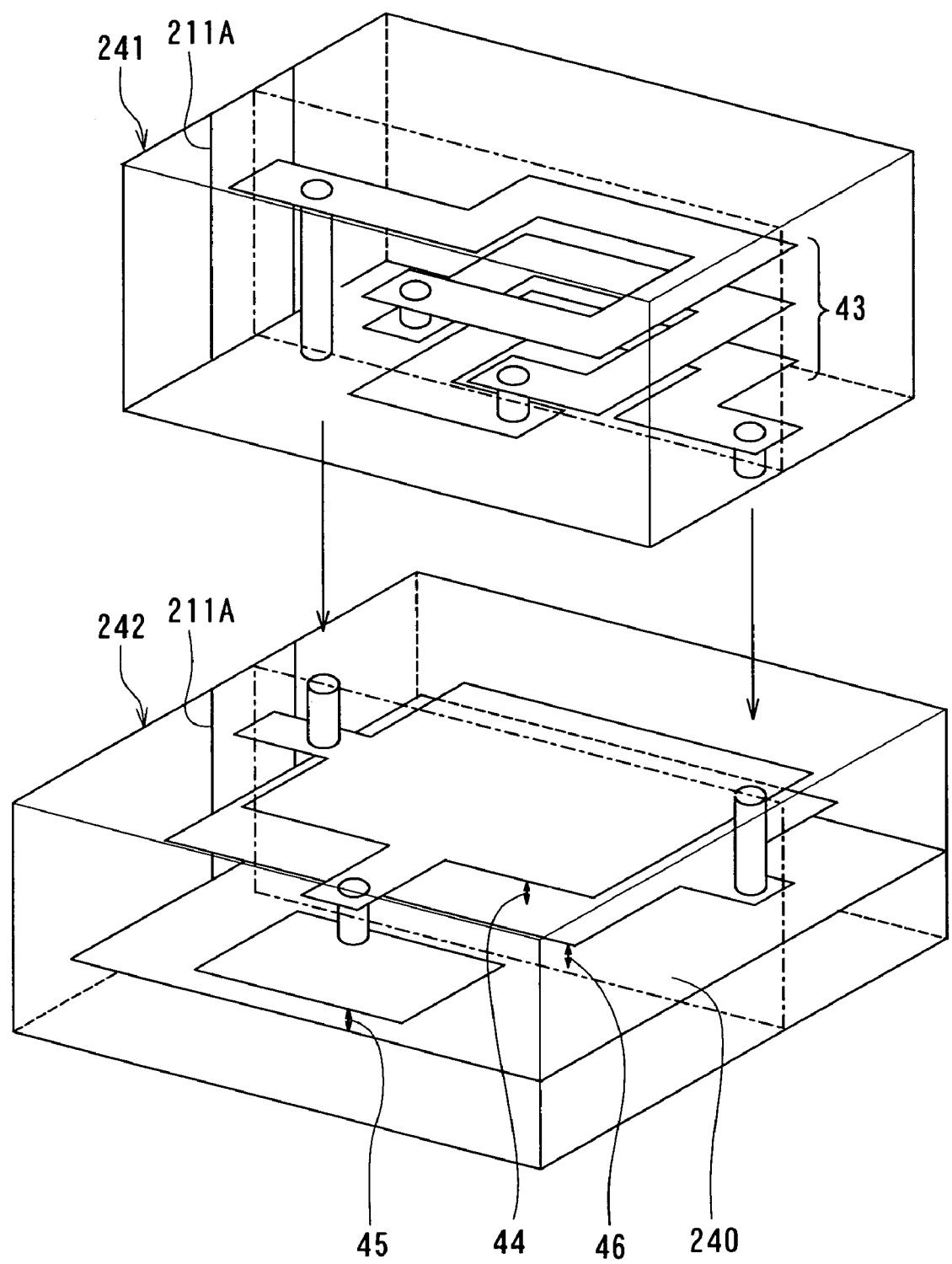
FIG. 33 is an exploded perspective view illustrating a portion of FIG. 32.

Reference is now made to FIG. 31 to FIG. 33 to describe a second reference front end module compared with the front end module 2 of the embodiment of the invention. The second reference front end module has a circuit configuration the same as that of the front end module 2 of FIG. 1. However, the second reference front end module is formed such that the triplexer and the two duplexers are discrete components and they are mounted on a motherboard by a method such as soldering. FIG. 31 is a top view illustrating an example of appearance of the triplexer of the second reference front end module. The triplexer 211 of FIG. 31 has terminals 211A, 211B, 211C and 211D corresponding to the first to fourth ports, and two ground terminals 211G. In the example shown in FIG. 31, the triplexer 211 has a length of 3.2 mm and a width of 2.5 mm. The triplexer 211 has a circuit configuration the same as that of the triplexer 11 of FIG. 3 or FIG. 7.

FIG. 32 is a cross-sectional view of the triplexer 211 of FIG. 31. FIG. 33 is an exploded perspective view illustrating the portions indicated with numerals 241 and 242 in FIG. 32. As shown in FIG. 32, the triplexer 211 has a multilayer substrate. In FIG. 32 and FIG. 33, the terminal 211A and an LPF 225 connected to the terminal 211A are shown. The LPF 225 is made of the conductor layers located inside or on the surface of the multilayer substrate. The LPF 225 has a configuration as shown in FIG. 12. That is, the LPF 225 has the inductor 43 and the three capacitors 44 to 46. In FIG. 32, numeral 240 indicates a ground layer.

The components of the second reference front end module are arranged such that, for example, the BPF 214 and the periphery circuits are excluded from the arrangement of FIG. 29 or FIG. 30 and that the diplexer 210 is replaced with the triplexer 211. Since the triplexer 211 is greater than the diplexer 210, the second reference front end module occupies an area on the mother board slightly greater than the first region 237 of FIG. 29 or FIG. 30.

The front end module 2 of the embodiment of the invention occupies a smaller area, compared with either of the first and second reference front end modules.

As thus described, the front end module 2 of the embodiment comprises: the triplexer 11 for separating the AMPS band, the PCS band and the GPS band from one another; the duplexer 12 for separating transmission signals and reception signals in the AMPS band from each other; and the duplexer 13 for separating transmission signals and reception signals in the PCS band from each other. The duplexer 12 includes the two acoustic wave elements each of which functions as a filter. The duplexer 13 includes the two acoustic wave elements each of which functions as a filter, too. In the embodiment, the triplexer 11 and the duplexers 12 and 13 are integrated on the multilayer substrate 130. The triplexer 11 is made up of the conductor layers located inside or on the surface of the multilayer substrate 130.

According to the embodiment as thus described, the front end module 2 connected to the single antenna 1 achieves processing of transmission signals and reception signals in each of the AMPS band and the PCS band, and reception signals of the GPS. According to the embodiment, the duplexers 12 and 13 are used to separate transmission signals and reception signals from each other, so that the front end module 2 is operable in the code division multiple access system. In addition, according to the embodiment, it is possible to implement the front end module 2 that easily achieves a reduction in size and weight, and combination and integration of components. Furthermore, it is possible to implement cellular phones having a position detecting function.

According to the embodiment, the chips 131 and 132 including the surface acoustic wave elements used in the BPFs 105 and 107 of the duplexer 12 are mounted on the top surface of the multilayer substrate 130, and the chips 133 and 134 including the surface acoustic wave elements used in the BPFs 105 and 107 of the duplexer 13 are also mounted on the top surface of the multilayer substrate 130. In addition, at least part of the circuit portions of the duplexers 12 and 13 except the surface acoustic wave elements is made up of the conductor layers located inside or on the surface of the multilayer substrate 130. As a result, a further reduction in size and weight of the front end module 2 is achieved.

According to the embodiment, the duplexers 12 and 13 including the acoustic wave elements are integrated with the triplexer 11, so that the impedance matching between each of the duplexers 12 and 13 and the periphery circuits is optimized. As a result, an improvement in performance of the front end module 2 is achieved, too.

The present invention is not limited to the foregoing embodiment but may be practiced in still other ways. For example, according to the embodiment, the chip including the acoustic wave elements used in the BPF 105 is separated from the chip including the acoustic wave elements used in the BPF 107. However, the two chips may be combined to form a single chip in the invention.

The combinations of the frequency bands employed in the embodiment are given by way of example and the invention is applicable to any other combination of frequency bands.

As thus described, the front end module of the invention comprises: the first separating means for separating the first to third frequency bands from one another; the second separating means for separating transmission signals and reception signals in the first frequency band from each other; and the third separating means for separating transmission signals and reception signals in the second frequency band from each other. The second separating means includes two acoustic wave elements each of which functions as a filter. The third separating means includes two acoustic wave elements each of which functions as a filter, too. A single multilayer substrate is used to integrate the first to third separating means. The first separating means is made up of the conductor layers located inside or on the surface of the multilayer substrate. As a result, the invention implements the front end module that is capable of processing transmission signals and reception signals in each of the first and second frequency bands and reception signals in the third frequency band and operable in the code division multiple access system, and that easily achieves a reduction in size and weight, and combination and integration of components.

According to the front end module of the invention, the two acoustic wave elements that the second separating means includes and the two acoustic wave elements that the third separating means includes may be mounted on the multilayer substrate for integration. In addition, at least part of the circuit portions of the second and third separating means except the acoustic wave elements may be made up of the conductor layers located inside or on the surface of the multi-layer substrate. In this case, a further reduction in size and weight of the front end module is achieved.

In the front end module of the invention, the reception signals in the third frequency band may be those used for a position detecting function. In this case, it is possible to implement a communications device such as a cellular phone having a position detecting function.

Obviously many modifications and variations of the present invention are possible in the light of the above teachings. It is therefore to be understood that within the scope of the appended claims the invention may be practiced otherwise than as specifically described.

The invention claimed is:

1. A front end module for processing transmission signals and reception signals in each of a first frequency band and a second frequency band and for processing reception signals in a third frequency band, the front end module comprising:
   a first separating means connected to an antenna and separating the first to third frequency bands from one another;
   a second separating means connected to the first separating means, including two acoustic wave elements each of which functions as a filter, and separating the transmission signals and the reception signals in the first frequency band from each other;
   a third separating means connected to the first separating means, including two acoustic wave elements each of which functions as a filter, and separating the transmission signals and the reception signals in the second frequency band from each other; and
   a single multilayer substrate for integrating the first to third separating means, wherein:
   the first separating means is made up of conductor layers located inside or on a surface of the multilayer substrate;
   the first separating means includes a filter;
   the second or third separating means includes a delay line that is provided between the first separating means and the acoustic wave elements and that adjusts an impedance;
   the two acoustic wave elements that the second separating means includes and the two acoustic wave elements that the third separating means includes are mounted on a top surface of the multilayer substrate; and
   the multilayer substrate includes as the conductor layers located inside the substrate: a ground layer; a conductor layer disposed between the ground layer and the top surface of the multilayer substrate and making up the delay line; and a conductor layer disposed between the ground layer and a bottom surface of the multilayer substrate and making up the filter that the first separating means includes,
   the front end module further comprising a terminal disposed on the bottom surface of the multilayer substrate and connected to the conductor layer making up the filter that the first separating means includes.

2. The front end module according to claim 1, further comprising a matching circuit provided between the delay line and the first separating means, wherein the multilayer substrate further includes, as the conductor layers located inside the substrate, a conductor layer disposed between the ground layer and the top surface of the multilayer substrate and making up the matching circuit.

3. The front end module according to claim 1, wherein the first separating means incorporates:

a filter allowing signals of frequencies in the first frequency band to pass and intercepting signals of frequencies in the second and third frequency bands;

a filter allowing signals of frequencies in the second frequency band to pass and intercepting signals of frequencies in the first and third frequency bands; and a filter allowing signals of frequencies in the third frequency band to pass and intercepting signals of frequencies in the first and second frequency bands.

4. The front end module according to claim 1, wherein the first separating means incorporates:

a first filter connected to the antenna and allowing signals of frequencies in one of the first to third frequency bands to pass and intercepting signals of frequencies in the other two of the frequency bands;

a second filter connected to the antenna, intercepting signals of frequencies in the one of the frequency bands that the first filter allows to pass, and allowing signals of frequencies in the two of the frequency bands that the first filter intercepts to pass;

a third filter connected to the second filter, allowing signals of frequencies in one of the two of the frequency bands to pass, and intercepting signals of frequencies in the other of the two of the frequency bands; and a fourth filter connected to the second filter, intercepting signals of frequencies in the one of the two of the frequency bands, and allowing signals of frequencies in the other of the two of the frequency bands to pass.

5. The front end module according to claim 1, wherein the reception signals in the third frequency band are signals used for a position detecting function.

6. The front end module according to claim 1, wherein the transmission signals and the reception signals in each of the first and second frequency bands are signals of a code division multiple access system.

* * * * *